(12) United States Patent
Shaikh et al.

(10) Patent No.: US 10,241,148 B2
(45) Date of Patent: Mar. 26, 2019

(54) VIRTUAL ACCESS OF INPUT/OUTPUT (I/O) FOR TEST VIA AN ON-CHIP STAR NETWORK

(71) Applicant: NVIDIA CORPORATION, Santa Clara, CA (US)

(72) Inventors: Ashfaq Shaikh, San Jose, CA (US); Wen-Hung Lo, San Jose, CA (US); Punit Kishore, Bangalore (IN); Amit Sanghani, San Jose, CA (US); Krishna Rajan, Bangalore (IN)

(73) Assignee: NVIDIA CORPORATION, Santa Clara, CA (US)

( * ) Notice: Subject to any disclaimer, the term of this patent is extended or adjusted under 35 U.S.C. 154(b) by 824 days.

(21) Appl. No.: 14/824,044

(22) Filed: Aug. 11, 2015

(65) Prior Publication Data

US 2017/0045575 A1 Feb. 16, 2017

(51) Int. Cl.
*G01R 31/28* (2006.01)

(52) U.S. Cl.
CPC ..... *G01R 31/2834* (2013.01); *G01R 31/2853* (2013.01); *G01R 31/2884* (2013.01)

(58) Field of Classification Search
CPC ...................... G01R 31/28–31/2898
USPC ..................................... 324/750.3
See application file for complete search history.

(56) References Cited

U.S. PATENT DOCUMENTS

| | | | | |
|---|---|---|---|---|
| 7,446,549 B2* | 11/2008 | Tomita | ........ | G01R 31/3008 324/750.3 |
| 7,898,279 B2* | 3/2011 | Chen | ........ | G01R 31/2884 324/763.01 |
| 9,759,765 B2* | 9/2017 | Gorman | ........ | G01R 31/2856 |
| 2013/0289661 A1* | 10/2013 | Griffith | ........ | A61N 1/37252 607/59 |

\* cited by examiner

*Primary Examiner* — Melissa J Koval
*Assistant Examiner* — Rahul Maini
(74) *Attorney, Agent, or Firm* — Artegis Law Group, LLP

(57) ABSTRACT

One embodiment of the present invention sets forth an integrated circuit that includes multiple input/output (I/O) pad groups. Each I/O pad group includes an on-chip star network, multiple I/O pads, multiple test multiplexers, a digital-to-analog converter (DAC), and a wide-range comparator. Each test multiplexer is configured to couple a different I/O pad to the on-chip star network. The DAC is configured to supply at least one of a source current, a sink current, and a first reference voltage to the on-chip star network. The wide-range comparator is configured to compare a voltage present on a first I/O pad included in the plurality of I/O pads with a second reference voltage. Advantageously, IO leakage and DC parametric testing may be performed on integrated circuits with high I/O pad counts using an ATE system with a significantly lower quantity of ATE test channels relative to prior approaches.

20 Claims, 12 Drawing Sheets

VIRTUAL ACCESS OF INPUT/OUTPUT (I/O) FOR TEST VIA AN ON-CHIP STAR NETWORK

BACKGROUND OF THE INVENTION

Field of the Invention

Embodiments of the present invention relate generally to integrated circuit testing and, more specifically, to virtual access of input/output (I/O) for test via an on-chip star network.

Description of the Related Art

At various stages of the manufacturing process for integrated circuits (ICs), various tests are performed to ensure that the integrated circuits meet or exceed certain specifications. In particular, manufacturers employ automated test equipment (ATE) systems to perform input leakage tests and DC parametric tests on each input/output (I/O) pad of each integrated circuit. These DC parametric tests include input voltage level threshold tests (also referred to herein as $V_{IH}/V_{IL}$ tests) and output drive strength tests (also referred to herein as $V_{OH}/V_{OL}$ tests).

Typically, the integrated circuit that is undergoing test is mounted to a particular load board, where the load board facilitates the connection of each I/O pad of the integrated circuit to a different ATE test channel of the of the ATE system. The load board is customized to the form factor of the integrated circuit undergoing test. As one example, a semiconductor wafer that includes multiple integrated circuits undergoing test could be mounted to one type of load board, whereas one or more packaged integrated circuits undergoing test could be mounted to a different type of load board. In general, the ATE system includes one ATE test channel for each I/O pad of the integrated circuit. During testing, the ATE system makes contact with each I/O pad of the integrated circuit through the load board via a different ATE test channel. As the complexity of integrated circuits has increased over time, the number of I/O pads on a typical integrated circuit has likewise increased. Consequently, complex integrated circuits having hundreds or even thousands of I/O pads are not uncommon. As a further consequence, the ATE system likewise needs hundreds or thousands of channels in order to make contact with and perform leakage and DC parametric testing on each I/O pad of the integrated circuit via the load board.

One drawback of conventional integrated circuit testing is that the cost of ATE systems increases significantly as the number of ATE test channels increases. Thus, performing IO leakage testing on more complex integrated circuits with high I/O pad counts typically involves very expensive ATE systems. Because of the high expense, relatively few of these more complex ATE systems are in circulation. As a result, companies that develop and manufacturer complex integrated circuits either do not have or cannot afford to purchase or rent such ATE systems in sufficient quantities to support large volume test capacity.

One possible solution to this problem is to design customized load boards with mechanical relays that permit one ATE test channel to perform tests on multiple I/O pads. For example, if the load board included one relay for every two or more pins, the ATE system could latch the relays in one position to test one portion of the pins on the integrated circuit. The ATE system could then latch the relays in another position to test a second portion of the pins. The ATE system could then latch the relays in yet another position to test a third portion of the pins, and so on, until all pins are tested. In this manner, a developer and manufacturer of complex integrated circuits is able to use ATE systems that have a fewer number of ATE channels than otherwise needed. Such ATE systems are more plentiful and less expensive to purchase or rent.

One drawback to these possible solutions is that mechanical relays are slow in response time, leading to longer test times. Another drawback to these possible solutions is that relays are expensive and have limited useful lives. That is, a load board that includes mechanical relays needs to be replaced after a specified number of test cycles, because the mechanical relays have reached the limits of reliable use. On the other hand, load boards that do not include mechanical relays typically have relatively long useful lives, and, therefore, are replaced at much longer intervals. As a result, the use of load boards with mechanical relays leads to higher test costs relative to using load boards without mechanical relays.

As the foregoing illustrates, what is needed in the art is a more effective approach for testing integrated circuits.

SUMMARY OF THE INVENTION

One embodiment of the present invention sets forth an integrated circuit that includes multiple input/output (I/O) pad groups. Each I/O pad group includes an on-chip star network, multiple I/O pads, multiple test multiplexers, a digital-to-analog converter (DAC), and a wide-range comparator. Each test multiplexer is configured to couple a different I/O pad to the on-chip star network. The DAC is configured to supply at least one of a source current, a sink current, and a first reference voltage to the on-chip star network. The wide-range comparator is configured to compare a voltage present on a first I/O pad included in the plurality of I/O pads with a second reference voltage.

Other embodiments of the present invention include, without limitation, a computer-readable medium including instructions for performing one or more aspects of the disclosed techniques, as well as a method for performing one or more aspects of the disclosed techniques.

At least one advantage of the disclosed technique is that IO leakage and DC parametric testing may be performed on integrated circuits with high I/O pad counts using an ATE system with a significantly lower quantity of ATE test channels relative to prior approaches. As a result, lower cost, more readily available ATE systems can be used for such integrated circuit testing.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

As further described herein, a device under test, such as an integrated circuit, includes one or more on-chip star networks, also referred to herein as wire-OR networks, and associated on-chip test circuitry. The on-chip star networks and associated on-chip test circuitry are enabled during testing in order to perform input leakage tests, input voltage level threshold tests, and output drive strength tests on the I/O pads of the device under test without contact to ATE test channels of an ATE tester. The on-chip star networks and associated on-chip test circuitry are disabled during normal operation. When disabled, the on-chip star network presents a high-impedance and a minimal capacitive load to the I/O pads, thereby substantially preventing performance degradation of the transmitters and receivers associated with the I/O pads during normal operation.

A single on-chip star network supports multiple I/O pads, where the multiple I/O pads are referred to herein as an I/O pad group. For example, each on-chip star network could support testing for any number of I/O pads, such as 8, 10, or 12 pads. By sharing an on-chip star network and associated circuitry among the I/O pads in an I/O pad group, the amount of die space devoted to this test circuitry is reduced. Because no ATE test channel is needed to perform these tests, I/O loopback tests of the transmitter and receiver can be performed without presenting an ATE test channel load to the I/O pad, thereby increasing the coverage and accuracy of such loopback testing. An ATE tester can also test the I/O pads in an I/O pad group by contacting a single pin in the I/O pad group. For example, if a device under test includes I/O pad groups of 12 I/O pads each, then an ATE tester could fully test an interface of the device under test that covers 192 I/O pads with 192/12=16 ATE test channels rather than 192 ATE test channels.

System Overview

Figure 1:
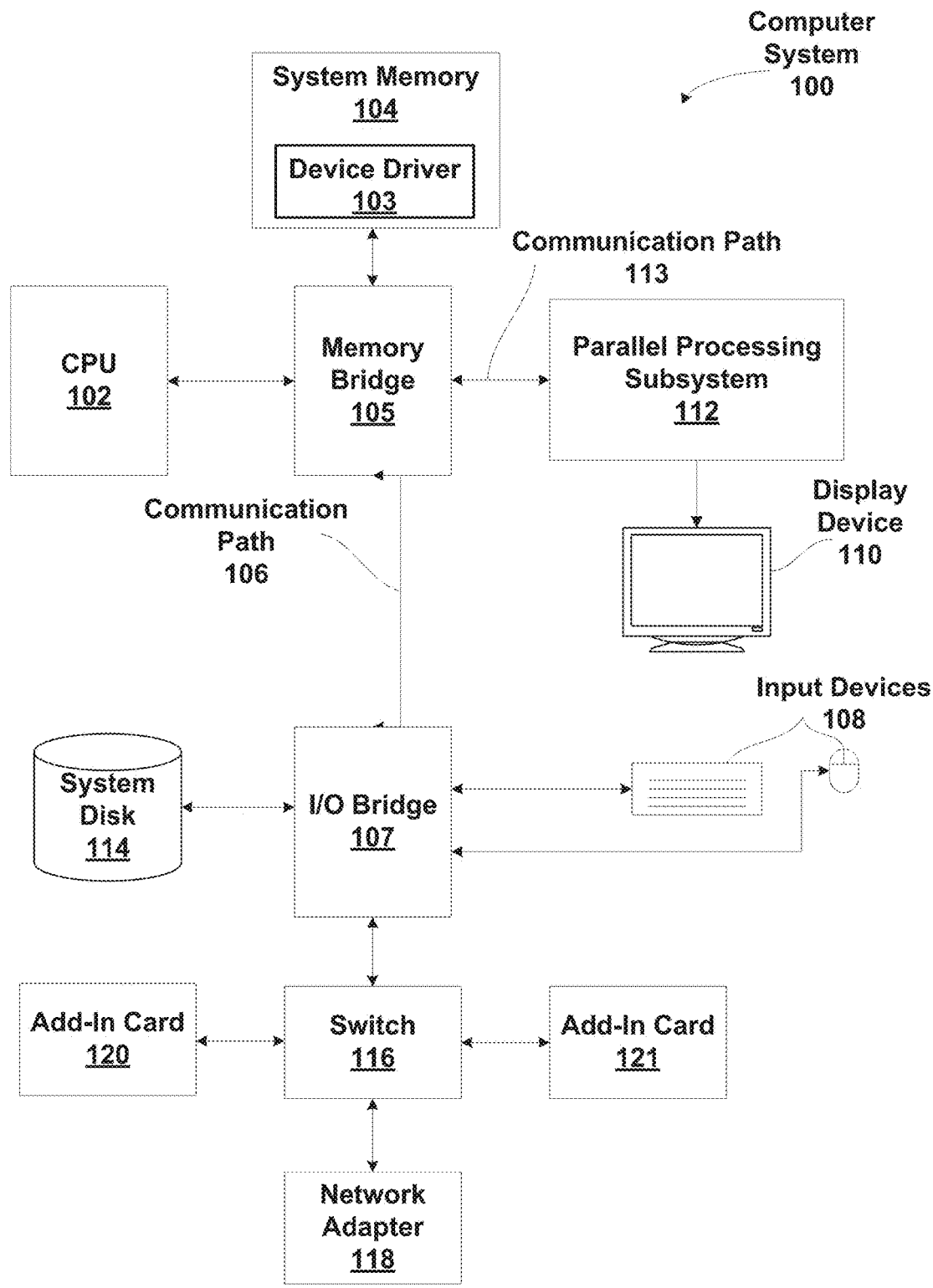
FIG. 1 is a conceptual illustration of a computer system configured to implement one or more aspects of the present invention.

FIG. 1 is a conceptual illustration of a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 is part of a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more other the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Input/Output (I/O) Pad Group with an On-Chip Star Network

Figure 2:
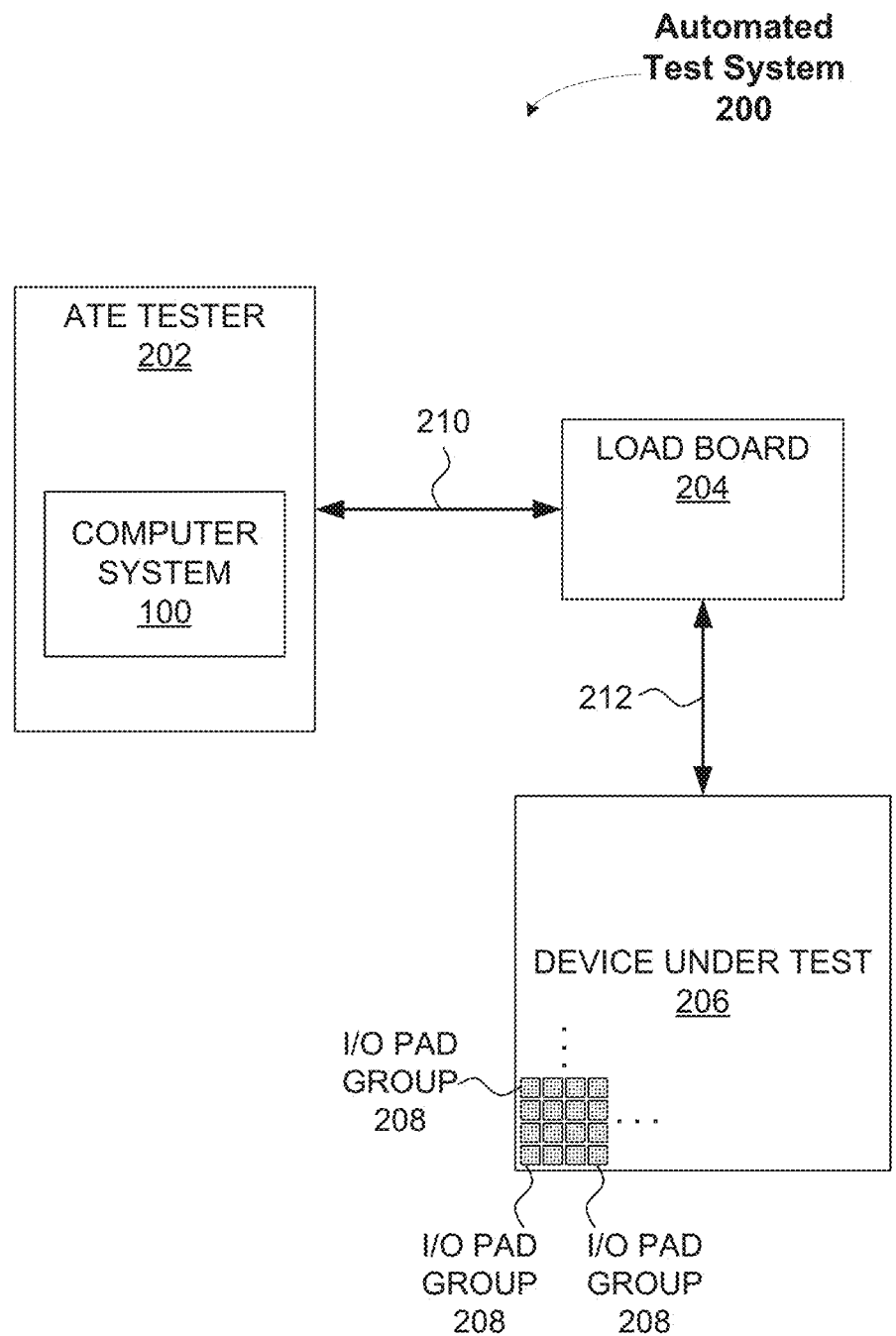
FIG. 2 is a block diagram of an automated test system within which the computer system of FIG. 1 may be implemented, according to one embodiment of the present invention.

FIG. 2 is a block diagram of an automated test system 200 within which the computer system 100 of FIG. 1 may be implemented, according to one embodiment of the present invention. As shown, and without limitation, the automated test system includes an ATE tester 202, a load board 204, and a device under test (DUT) 206.

The ATE tester 202 is configured to perform various tests on the I/O pads of the DUT 206 by causing the computer system to execute an automated test application program (not explicitly shown) on the computer system. These tests include input leakage tests, input voltage level threshold tests, and output drive strength tests. The ATE tester 202 includes multiple ATE test channels (not explicitly shown), where each ATE test channel makes contact with one I/O pad. Via the ATE test channels, the ATE tester 202 maintains direct contact to one pin in each IO pad group of the DUT 206. During a first pass, the ATE tester 202 causes the DUT to test the I/O pads via the on-chip star network and associated on-chip test circuits. During this first pass, the ATE tester 202 does not use the ATE test channels to perform tests on the DUT 206. If the DUT 206 fails the first pass test, then the DUT 206 may be discarded and no further testing is performed. If the DUT passes the first pass test, then the ATE tester 202 performs additional tests on the DUT 206.

During a second pass, the ATE tester 202 tests the I/O pads of the DUT 206, or portions of the DUT 206, directly via the ATE test channels. The ATE tester 202 performs these additional tests on the DUT 206, typically with greater precision and accuracy than the tests performed during the first pass test. In particular, the on-chip test circuits are subject to process variations associated with the semiconductor manufacturing process, whereas the ATE tester 202 is not. As a result, the ATE tester 202 can compare results from contactless test operation during the first pass test with contact testing via ATE test channels during the second pass test in order to calibrate the test results from the first pass test.

The load board is configured to receive one or more devices for testing, such as DUT 206. The load board 204 makes contact with the ATE test channels of the ATE tester 202 via contacts 210. The load board 204, in turn, makes contact with the I/O pads of the DUT 206 via contacts 212. Via contacts 210 and contacts 212, the load board 204 connects ATE test channels of the ATE tester 202 to specific I/O pads of the DUT 206.

The DUT 206 is a device that is currently undergoing tests as determined by the ATE tester 202. The DUT 206 may be in any technical feasible form, including, without limitation, a semiconductor wafer that includes multiple integrated circuits, a packaged integrated circuit, or a system-on-chip (SoC). The DUT 206 includes one or more I/O pad groups, 208, where each I/O pad group 208 includes multiple I/O pads, an on-chip star network, and associated on-chip test circuitry. These on-chip star networks and test circuitry facilitate testing of the I/O pads of each respective I/O pad group 208 included in the DUT 206, as further described herein.

Figure 3:
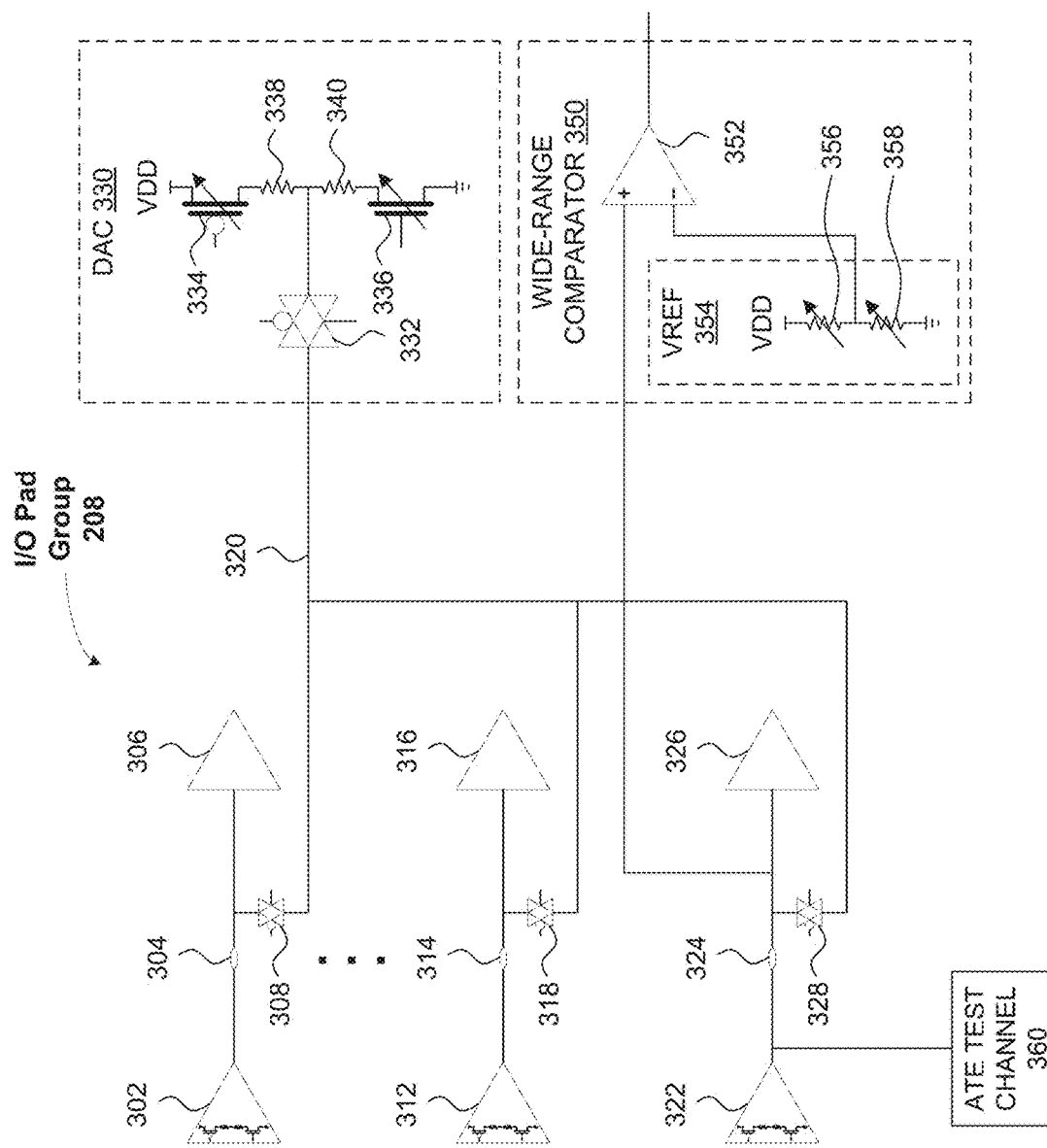
FIG. 3 is a block diagram of an input/output (I/O) pad group of the DUT of FIG. 2, according to one embodiment of the present invention.

FIG. 3 is a block diagram of an input/output (I/O) pad group 208 of the DUT 206 of FIG. 2, according to one embodiment of the present invention. As shown, and without limitation, the I/O pad group 208 includes transmitters 302, 312, and 314, receivers 306, 316, and 326, I/O pads 304, 314, and 324, test multiplexers 308, 318, and 328, an on-chip star network 320, a digital-to-analog converter (DAC) 330, a wide-range comparator 350, and an ATE test channel 360. Although only three I/O pads 304, 314, and 324 are illustrated in FIG. 3, the I/O pad group 208 may be configured with any number of I/O pads within the scope of this invention.

The transmitters 302, 312, and 314 are the output drivers that transmit signals to the I/O pads 304, 314, and 324 of the I/O pad group 208, respectively. During test operation, the transmitters 302, 312, and 314 are tested for output drive strength. Typically, an I/O pad that is an output connection or a bi-directional connection is associated with a transmitter, while an I/O pad that is only an input connection is not associated with a transmitter. The transmitters 302, 312, and 314 are placed into a tristate mode in order to disable the transmitters 302, 312, and 314 when the receivers 306, 316, and 326 are being tested.

The receivers 306, 316, and 326 are the input connections that receive signals from the I/O pads 304, 314, and 324 of the I/O pad group 208, respectively. During test operation, the receivers 306, 316, and 326 are tested for input leakage and input voltage level threshold levels. Typically, an I/O pad that is an input connection or a bi-directional connection is associated with a receiver, while an I/O pad that is only an output connection or is not associated with a receiver.

The I/O pads 304, 314, and 324 are the contact points of the I/O pad group 208. During normal operation the I/O pads 304, 314, and 324 contact other components in a system in order to transmit signals to and receive signals from these other components. During test operation, the ATE test channel 360 contacts I/O pad 324 to perform contact testing for the I/O pads 304, 314, and 324 in the I/O pad group 208.

The test multiplexers 308, 318, and 328, control connections between the I/O pads 304, 314, and 324 and the on-chip star network 320, respectively. During certain test operations, a single test multiplexer in the I/O pad group 208 may be enabled while all other test multiplexers are disabled. During other test operations, two or more multiplexers in the I/O pad group 208 may be enabled simultaneously. When test multiplexer 308 is enabled, transmitter 302 and receiver 306 are connected to the on-chip star network 320. When test multiplexer 308 is disabled, transmitter 302 and receiver 306 are isolated from the on-chip star network 320. Likewise, when test multiplexer 318 is enabled, transmitter 312 and receiver 316 are connected to the on-chip star network 320. When test multiplexer 318 is disabled, transmitter 312 and receiver 316 are isolated from the on-chip star network 320. When test multiplexer 328 is enabled, transmitter 322 and receiver 326 are connected to the on-chip star network 320. When test multiplexer 328 is disabled, transmitter 322 and receiver 326 are isolated from the on-chip star network 320. During contact testing via the ATE test channel 360, test multiplexer 328 is enabled, providing a connection path for the ATE test channel 360 to transmit signals to and receive signals from the on-chip star network 320. During on-chip testing, test multiplexer 328 is enabled during tests that utilize the wide-range comparator 350, providing a connection path between the wide-range comparator 350 and the on-chip star network 320.

The on-chip star network 320 forms a wire-OR connection among the test multiplexers 308, 318, and 328, the DAC 330, and the wide-range comparator 350. On-chip testing is typically performed by enabling one or more test multiplexers 308, 318, and 328 and enabling multiplexer 332 on the DAC 330 to connect the enabled devices to the on-chip star network 320.

The DAC 330 provides a source current, sink current, or voltage source to the on-chip star network 320 during various test operations. For example, the DAC 330 could provide a source current or a sink current during input leakage testing. The DAC 330 could provide a voltage to a receiver input for input voltage level threshold testing. As shown, and without limitation, the DAC 330 includes a multiplexer 332, an NMOS field-effect transistor (FET) 334, a PMOS FET 336, a pull-up resistor 338, and a pull-down resistor 340.

The multiplexer 332 control the connection between the DAC 330 and the on-chip star network 320, respectively. When multiplexer 332 is enabled, the DAC 330 is connected to the on-chip star network 320. When multiplexer 332 is disabled, the DAC 330 is isolated from the on-chip star network 320.

NMOS FET 334 and pull-up resistor 338 couple the on-chip star network 320 to the source voltage $V_{DD}$ during test operations. NMOS FET 334 is controllable a digital value. The DAC 330 converts the digital value to an analog voltage that determines the gain of NMOS FET 334. In this way, the digital value can vary the gain level of the NMOS FET 334 from fully cut off to a maximum gain level.

Similarly, PMOS FET 336 and pull-down resistor 340 couple the on-chip star network 320 to the ground during test operations. PMOS FET 336 is controllable a digital value. The DAC 330 converts the digital value to an analog voltage that determines the gain of PMOS FET 336. In this way, the digital value can vary the gain level of the PMOS FET 336 from fully cut off to a maximum gain level.

The digital value for PMOS FET 336 is separate from the digital value for NMOS FET 334. As a result, NMOS FET 334 and PMOS FET 336 are separately controllable. For example, if the PMOS FET 336 is fully cut off, then the digital value for the NMOS FET 334 could determine a source current supplied to the on-chip star network 320. If the NMOS FET 334 is fully cut off, then the digital value for the PMOS FET 336 could determine a sink current supplied to the on-chip star network 320. If neither the NMOS FET 334 nor the PMOS FET 336 are cut off, then the NMOS FET 334 and pull-up resistor 338 form a voltage divider with PMOS FET 336 and pull-down resistor 340, whereby the relative digital values for NMOS FET 334 and the PMOS FET 336 determine the voltage applied by the DAC 330 to the on-chip star network 320.

The wide-range comparator 350 compares a voltage present on I/O pad 324 against a reference voltage. As shown, and without limitation, the wide-range comparator 350 includes a differential amplifier 352 and a voltage reference (VREF) 354 that, in turn, includes a variable pull-up resistor 356 and a variable pull-down resistor 358. The variable pull-up resistor 356 and variable pull-down resistor 358 are separately controllable via digital values. These digital values control the relative resistance of variable pull-up resistor 356 and variable pull-down resistor 358. As a result, the variable pull-up resistor 356 and variable pull-down resistor 358 are adjustable between ground (zero volts) and $V_{DD}$. The differential amplifier 352 compares the voltage present on I/O pad 324 against VREF 354. If the voltage present on I/O pad 324 is higher than the VREF 354 voltage, then the differential amplifier 352 presents a high voltage at the output. If the voltage present on I/O pad 324 is lower than the VREF 354 voltage, then the differential amplifier 352 presents a low voltage at the output. In some embodiments, the differential amplifier 352 may be a wide-range, or wide common mode, comparator adapted for test purposes. By contrast, the receivers 306, 316, 326 may include a narrow-range, or narrow common mode, comparator adapted for high performance during normal operation.

The ATE test channel 360 is an ATE test channel of the ATE tester 202. The ATE test channel 360 is configured to couple to the on-chip star network 320 via I/O pad 324. During contact testing via the ATE test channel 360, test multiplexer 328 is enabled, provided contact between the ATE test channel 360 and the on-chip star network 320. In this manner, the ATE test channel 360 can transmit signals to and receive signals from the on-chip star network 320.

The I/O pad group 208 is configurable to perform various tests including input leakage tests, input voltage level threshold tests, and output drive strength tests, as now described.

Figure 4:
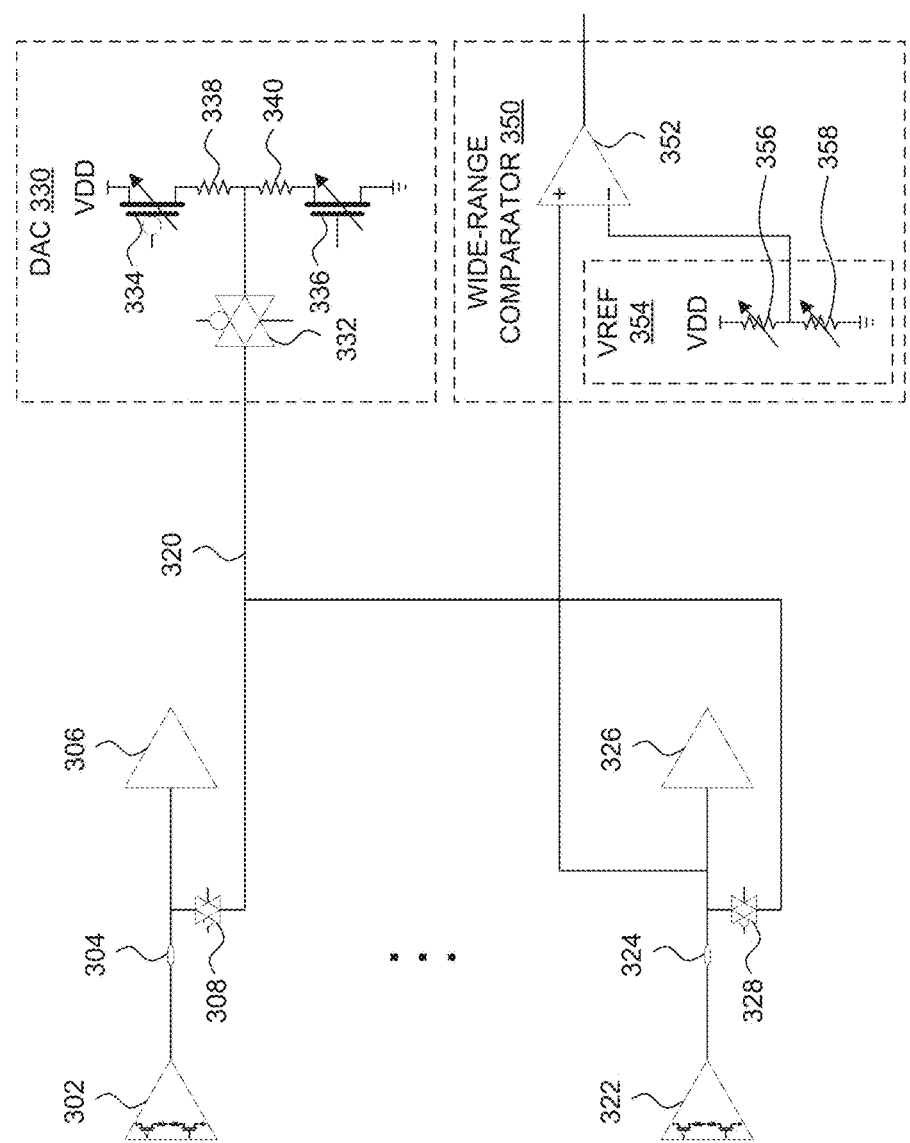
FIG. 4 illustrates the I/O pad group of FIG. 3 configured to perform input leakage testing, according to one embodiment of the present invention.

FIG. 4 illustrates the I/O pad group 208 of FIG. 3 configured to perform input leakage testing, according to one embodiment of the present invention. As shown, and without limitation, the I/O pad group 208 includes transmitters 302, and 314, receivers 306, and 326, I/O pads 304, and 324, test multiplexers 308, and 328, an on-chip star network 320, a DAC 330, and a wide-range comparator 350. The elements illustrated in FIG. 4 function substantially the same as described in FIG. 3, except as further described below. Although only two I/O pads 304, 324 are shown in FIG. 4, any number of I/O pads may be included in the I/O pad group within the scope of the present invention.

To configure the I/O pad group 208 for leakage testing of one more receivers 306, 326, the ATE tester 202 causes multiplexer 332 to be enabled in order to couple the DAC 330 to the on-chip star network 320. The ATE tester 202 causes test multiplexer 328 to be enabled in order to couple the wide-range comparator 350 to the on-chip star network 320. If receiver 326 is the receiver undergoing input leakage testing, then no additional test multiplexers are enabled, because receiver 326 is directly coupled to the wide-range comparator 350. If, however, receiver 306 is undergoing input leakage testing, then the ATE tester 202 causes test multiplexer 308 to be enabled in order to couple receiver 306 to the on-chip star network 320. The ATE tester 202 causes transmitters 302 and 322 to enter a tristate mode to prevent the transmitters 302 and 322 from negatively impact the input leakage test results. The ATE tester 202 then causes the I/O pad group 208 to enter the input leakage test mode. Two types of input leakage testing are performed, a source current leakage test and a sink current leakage test.

During the source current leakage test, the ATE tester 202 causes the PMOS FET 336 to be cutoff, thereby isolating pull-down resistor 340 from ground. The ATE tester 202 then causes a digital value to be set for the NMOS FET 334, where the digital value is typically based on the circuit technology or manufacturing technology of the device under test 206. The digital value causes the NMOS FET 334 to supply a source current for the on-chip star network 320. The ATE tester 202 then causes the wide-range comparator 350 to measure the voltage present on the on-chip star network 320 by varying the VREF 354 and determining the VREF 354 voltage at which the output of differential amplifier 352 changes from one level to another. This VREF 354 voltage is then compared with an expected voltage. The input leakage of the receiver 306 or 326 that is undergoing leakage test may cause the voltage present on the on-chip star network 320 to change. If the voltage change exceeds a threshold, then the receiver 306 or 326 that is undergoing leakage test is drawing too much leakage current, and the receiver 306 or 326 fails the input leakage test.

During the sink current leakage test, the ATE tester 202 causes the NMOS FET 334 to be cutoff, thereby isolating pull-up resistor 338 from $V_{DD}$. The ATE tester 202 then causes a digital value to be set for the PMOS FET 336, where the digital value is typically based on the circuit technology or manufacturing technology of the device under test 206. The digital value causes the PMOS FET 336 to supply a sink current for the on-chip star network 320. The ATE tester 202 then causes the wide-range comparator 350 to measure the voltage present on the on-chip star network 320 by varying the VREF 354 and determining the VREF 354 voltage at which the output of differential amplifier 352 changes from one level to another. This VREF 354 voltage is then compared with an expected voltage. The input leakage of the receiver 306 or 326 that is undergoing leakage test may cause the voltage present on the on-chip star network 320 to change. If the voltage change exceeds a threshold, then the receiver 306 or 326 that is undergoing leakage test is supplying too much leakage current, and the receiver 306 or 326 fails the input leakage test.

Figure 5:
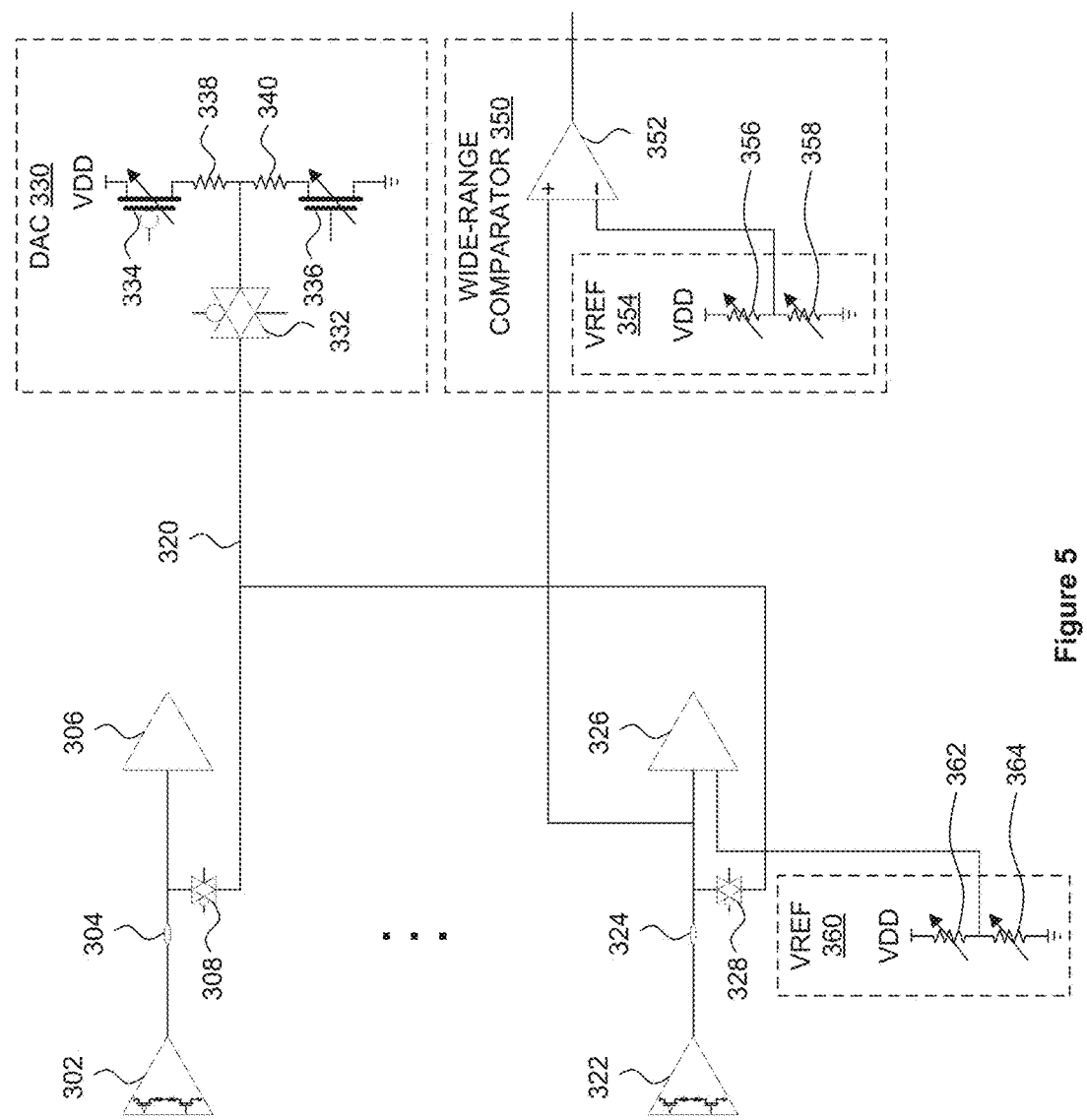
FIG. 5 illustrates the I/O pad group of FIG. 3 configured to perform input voltage level threshold testing, according to one embodiment of the present invention.

FIG. 5 illustrates the I/O pad group 208 of FIG. 3 configured to perform input voltage level threshold testing, according to one embodiment of the present invention. As shown, and without limitation, the I/O pad group 208 includes transmitters 302, and 314, receivers 306, and 326, I/O pads 304, and 324, test multiplexers 308, and 328, an on-chip star network 320, a DAC 330, and a wide-range comparator 350. The elements illustrated in FIG. 5 function substantially the same as described in FIGS. 3-4, except as further described below. Although only two I/O pads 304, 324 are shown in FIG. 5, any number of I/O pads may be included in the I/O pad group within the scope of the present invention.

To configure the I/O pad group 208 for input voltage level threshold testing of one more receivers 306, 326, the ATE tester 202 causes multiplexer 332 to be enabled in order to couple the DAC 330 to the on-chip star network 320. If receiver 306 is the receiver undergoing input voltage level threshold testing, then the ATE tester 202 causes test multiplexer 308 to be enabled in order to couple the input of the receiver 306 to the on-chip star network 320. If receiver 326 is the receiver undergoing input voltage level threshold testing, then ATE tester 202 causes test multiplexer 328 to be enabled in order to couple the input of the receiver 326 to the on-chip star network 320.

Because the receiver 326 is a differential amplifier, then the other input of the receiver 326 is coupled to a voltage reference (VREF) 360. The VREF 360 includes a variable pull-up resistor 362 and a variable pull-down resistor 364. The variable pull-up resistor 362 and variable pull-down resistor 364 are separately controllable via digital values. These digital values control the relative resistance of variable pull-up resistor 362 and variable pull-down resistor 364. As a result, the variable pull-up resistor 362 and variable pull-down resistor 364 are adjustable between ground (zero volts) and $V_{DD}$.

The ATE tester 202 causes transmitters 302 and 322 to enter a tristate mode to prevent the transmitters 302 and 322 from negatively impact the input voltage level threshold test results. The wide-range comparator 350 is not used for this test. The ATE tester 202 then causes the I/O pad group 208 to enter the input voltage level threshold test mode. Two types of input voltage level threshold testing are performed, a high input voltage level threshold test ($V_{IH}$ test) and a low input voltage level threshold test ($V_{IL}$ test).

During the $V_{IH}$ test, the ATE tester 202 causes both the NMOS FET 334 and the PMOS FET 336 to be turned on, creating a voltage divider between NMOS FET 334 and pull-up resistor 338 to VDD and PMOS FET 336 and pull-down resistor 340 to ground, whereby the relative digital values for NMOS FET 334 and the PMOS FET 336 determine the voltage applied by the DAC 330 to the on-chip star network 320. If the receiver 326 is a differential amplifier, then the ATE tester 202 causes a digital value to be set for the variable resistor 362 and the variable resistor 364. The ATE tester 202 causes the receiver 326 to have a low output level. The ATE tester 202 then causes the DAC 330 or the VREF 360 to vary the voltage on the respective input pin of receiver 326 until the output of receiver 326 transitions from a low level to a high level. The voltage at which this transition occurs is then compared to a specific $V_{IH}$ parameter to determine whether the receiver 326 passed the input threshold test.

During the $V_{IL}$ test, the ATE tester 202 causes both the NMOS FET 334 and the PMOS FET 336 to be turned on, creating a voltage divider between NMOS FET 334 and pull-up resistor 338 to VDD and PMOS FET 336 and pull-down resistor 340 to ground, whereby the relative digital values for NMOS FET 334 and the PMOS FET 336 determine the voltage applied by the DAC 330 to the on-chip star network 320. If the receiver 326 is a differential amplifier, then the ATE tester 202 causes a digital value to be set for the variable resistor 362 and the variable resistor 364. The ATE tester 202 causes the receiver 326 to have a high output level. The ATE tester 202 then causes the DAC 330 or the VREF 360 to vary the voltage on the respective input pin of receiver 326 until the output of receiver 326 transitions from a high level to a low level. The voltage at which this transition occurs is then compared to a specific $V_{IL}$ parameter to determine whether the receiver 326 passed the input threshold test.

Figure 6:
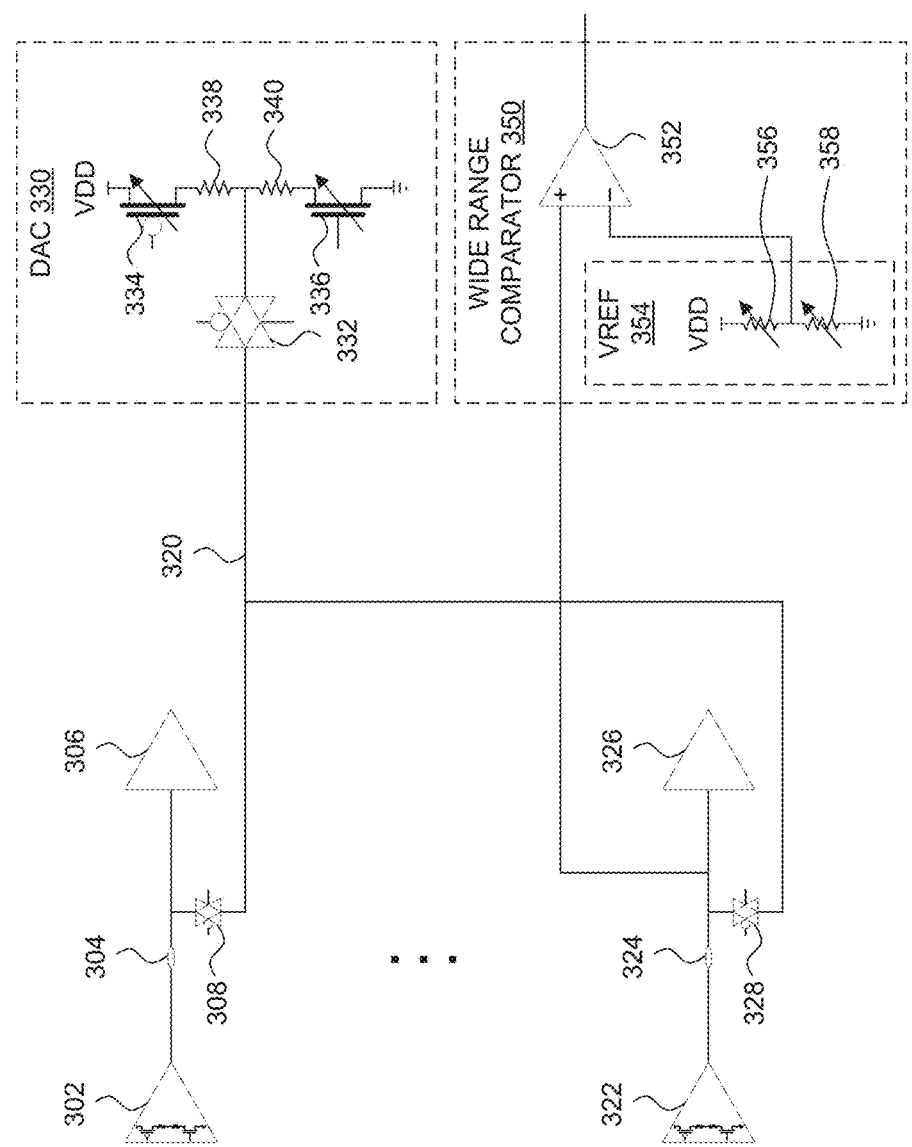
FIG. 6 illustrates the I/O pad group of FIG. 3 configured to perform output drive strength testing, according to one embodiment of the present invention.
Figure 7A:
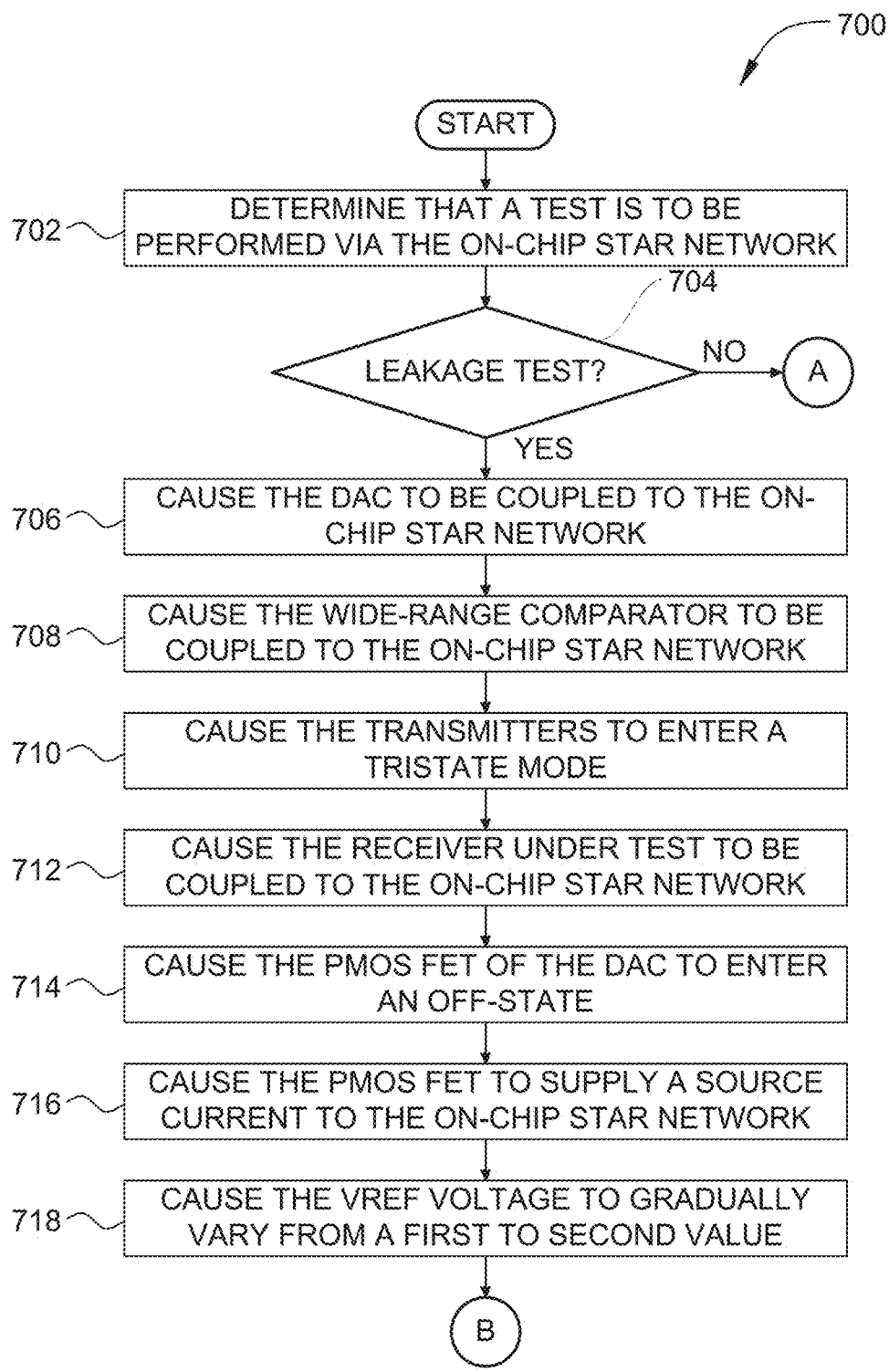
FIGS. 7A-7F set forth a flow diagram of method steps for testing an integrated circuit, according to one embodiment of the present invention.
Figure 7B:
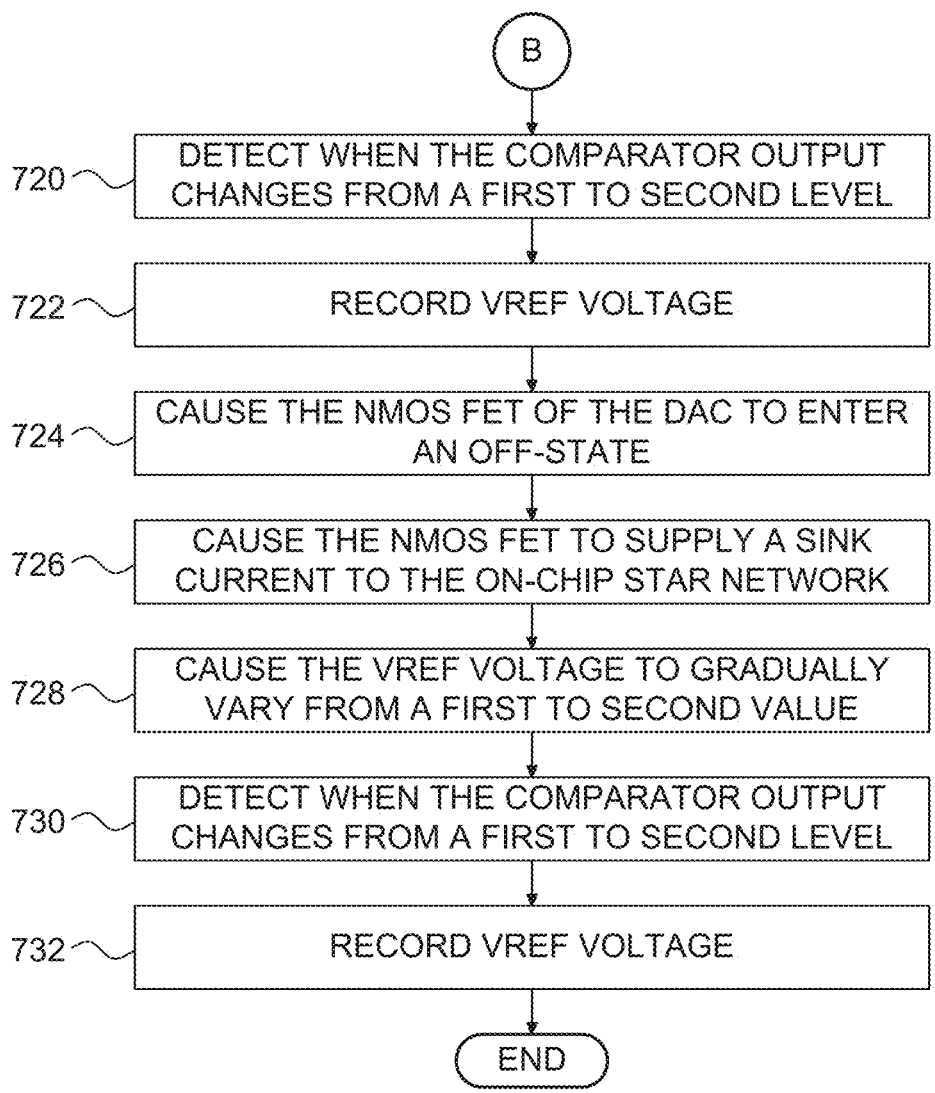
Figure 7C:
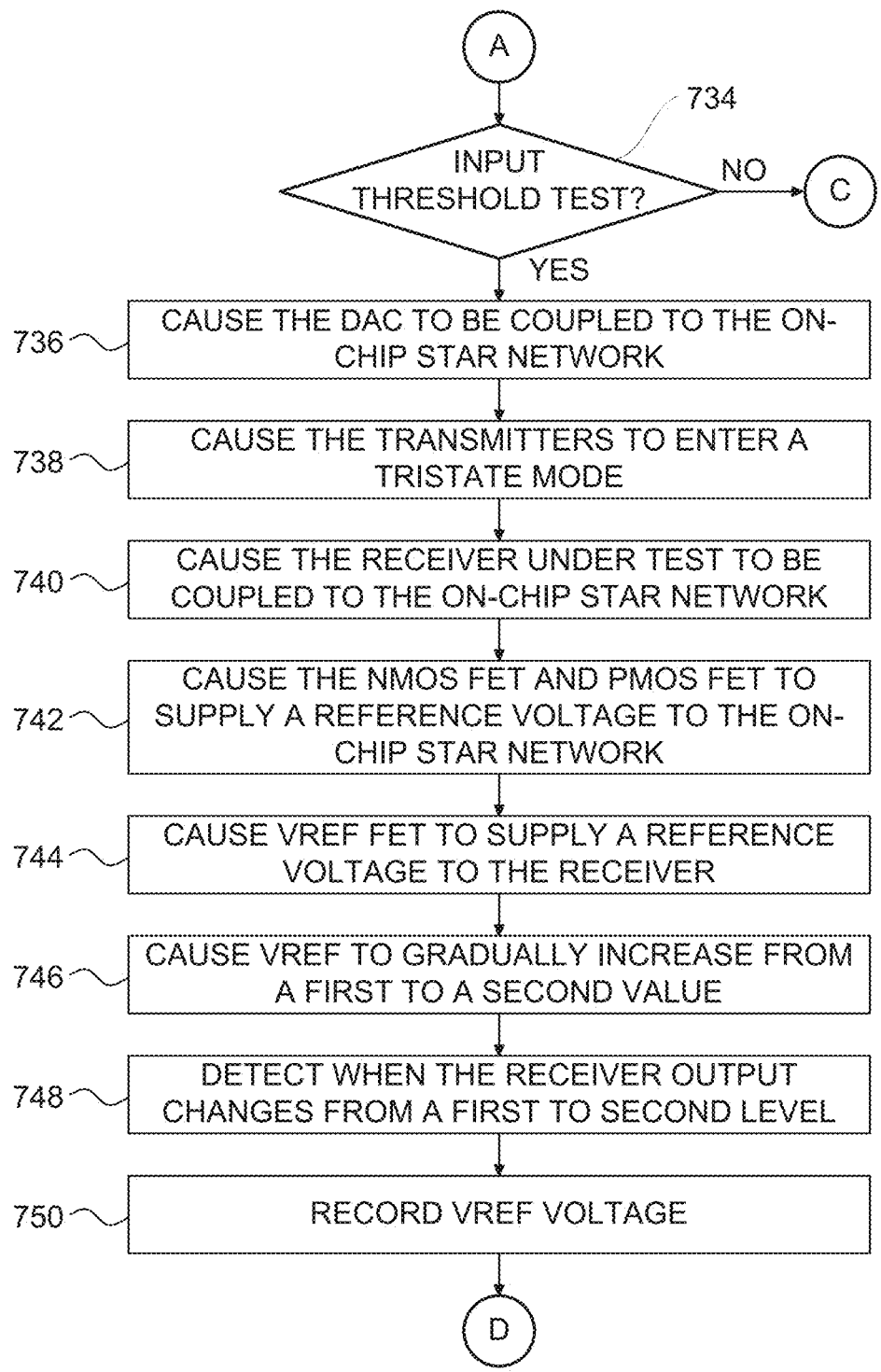
Figure 7D:
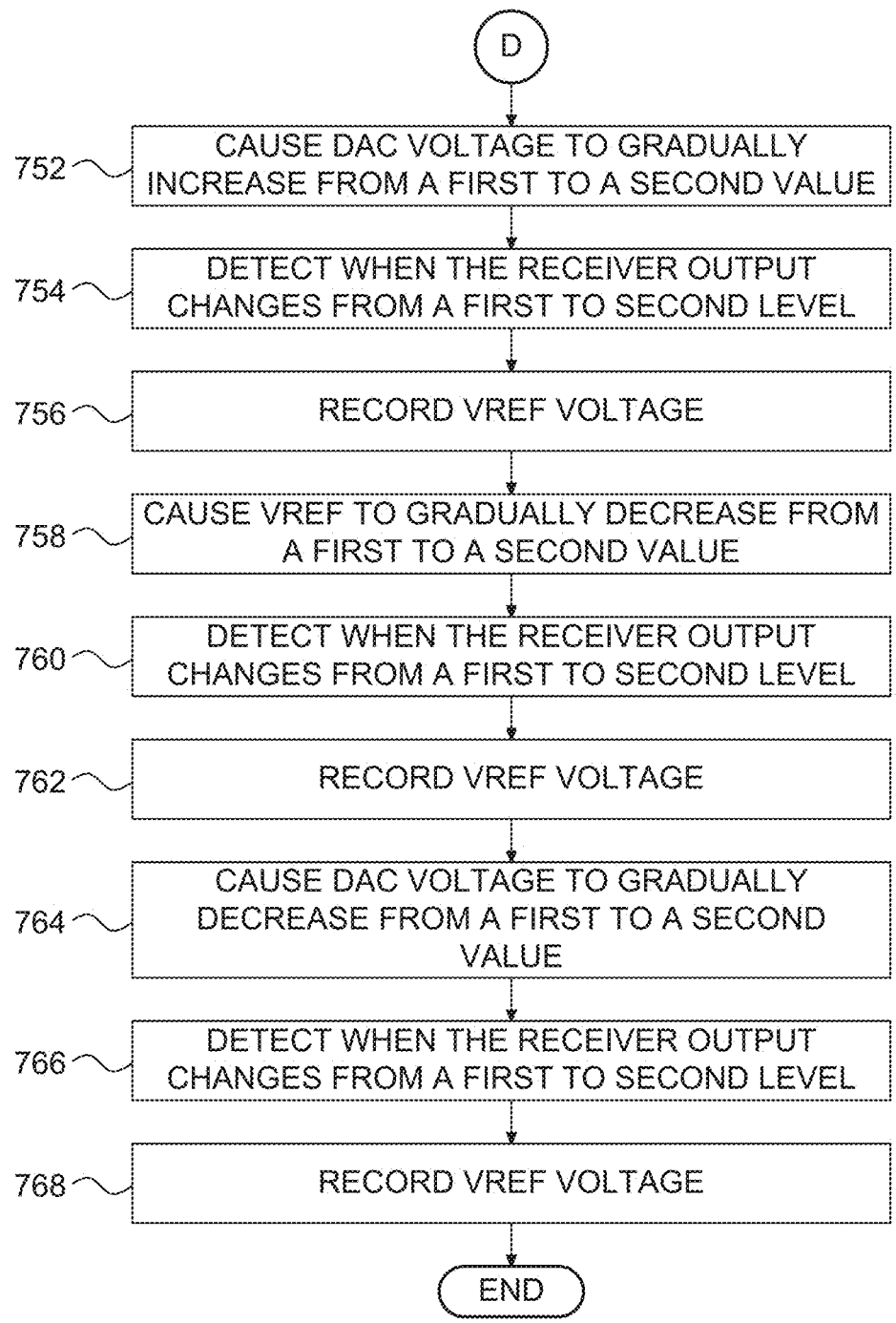
Figure 7E:
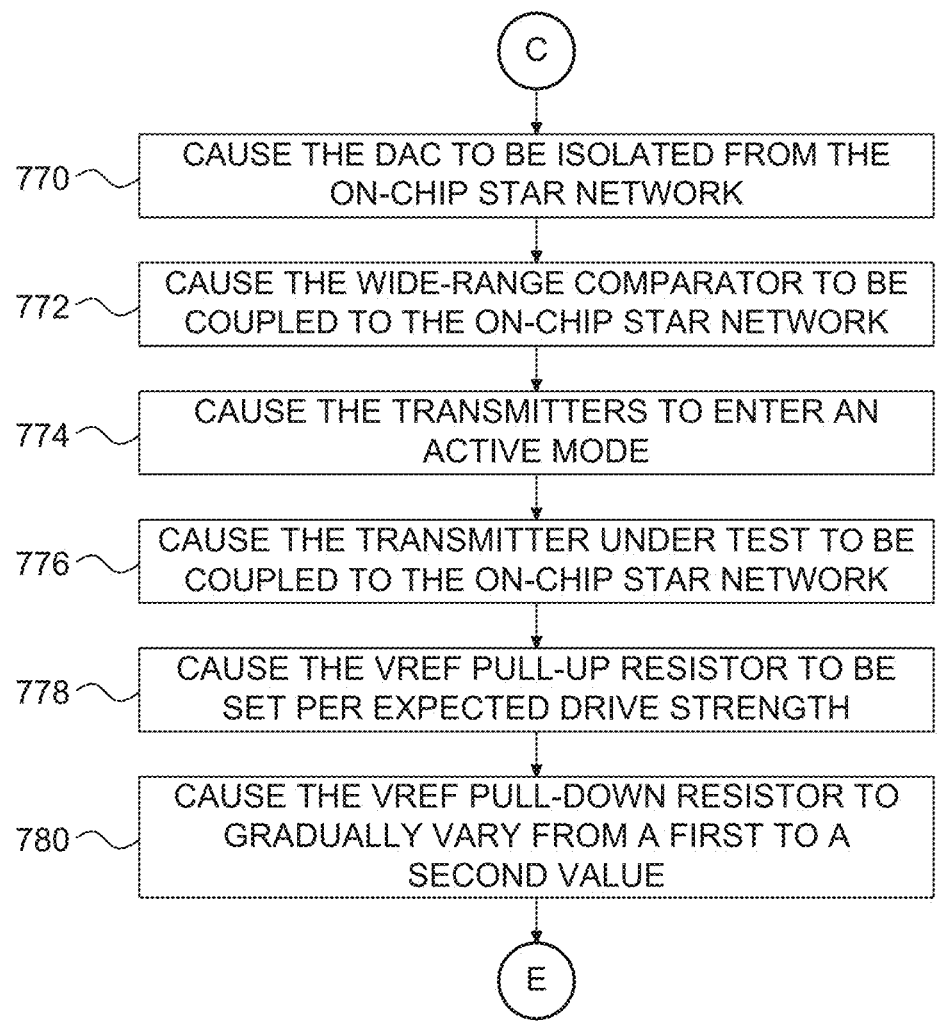
Figure 7F:
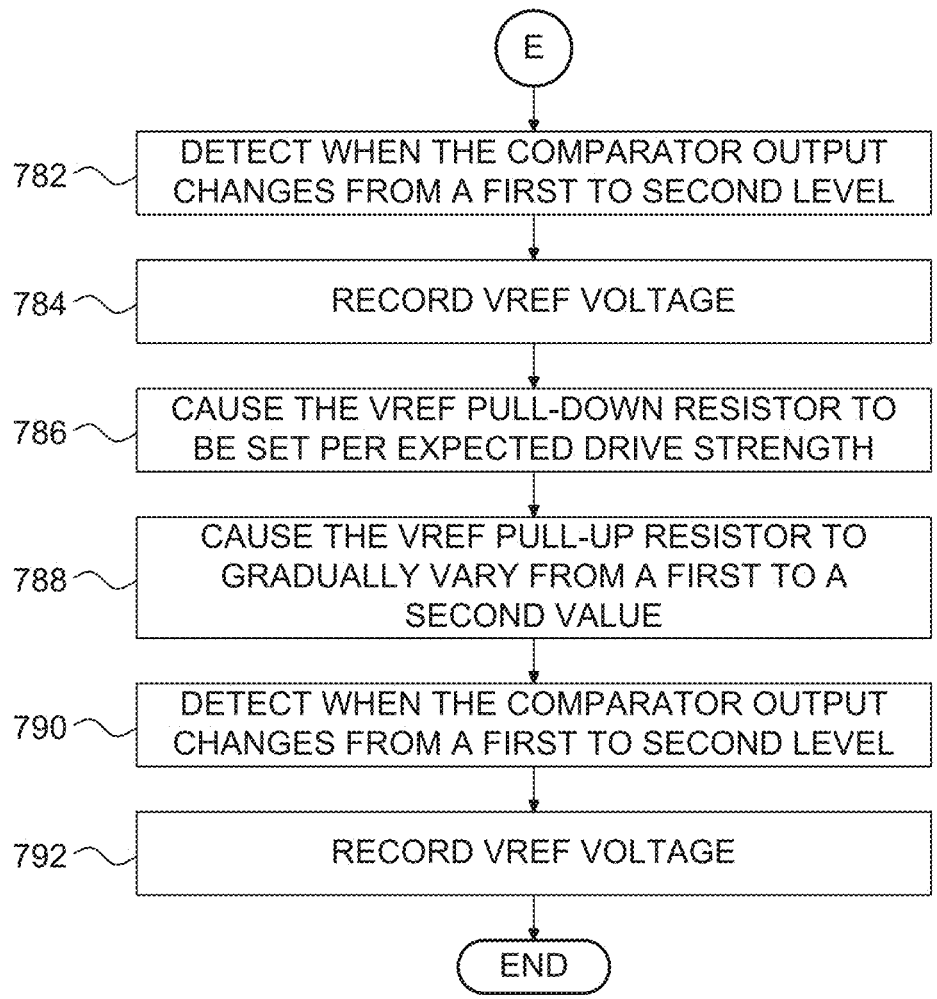

FIG. 6 illustrates the I/O pad group 208 of FIG. 3 configured to perform output drive strength testing, according to one embodiment of the present invention. As shown, and without limitation, the I/O pad group 208 includes transmitters 302, and 314, receivers 306, and 326, I/O pads 304, and 324, test multiplexers 308, and 328, an on-chip star network 320, a DAC 330, and a wide-range comparator 350. The elements illustrated in FIG. 6 function substantially the same as described in FIGS. 3-5, except as further described below. Although only two I/O pads 304, 324 are shown in FIG. 6, any number of I/O pads may be included in the I/O pad group within the scope of the present invention.

To configure the I/O pad group 208 for output voltage drive level testing of one more receivers 306, 326, the ATE tester 202 causes multiplexer 332 to be disabled in order to isolate the DAC 330 from the on-chip star network 320. The DAC 330 is not used for this test. The ATE tester 202 causes transmitters 302 and 322 to enter a tristate mode to prevent the transmitters 302 and 322 from negatively impact the input voltage level threshold test results. If transmitter 302 is the transmitter undergoing output voltage drive level testing, then the ATE tester 202 causes test multiplexer 308 to be enabled in order to couple the output of the transmitter 302 to the on-chip star network 320. If transmitter 322 is the transmitter undergoing output voltage drive level testing, then ATE tester 202 causes test multiplexer 328 to be enabled in order to couple the output of the receiver 326 to the on-chip star network 320. The ATE tester 202 causes multiplexer 328 to be enabled, if not enabled already, to couple the on-chip star network 320 to the wide-range comparator 350. The ATE tester 202 then causes the I/O pad group 208 to enter the output drive strength test mode. Two types of output drive strength testing are performed, a high output voltage level threshold test ($V_{OH}$ test) and a low output voltage level threshold test ($V_{OL}$ test).

During the $V_{OH}$ test, the ATE tester 202 causes the transmitter 302 or 322 to drive the on-chip star network 320 by enabling the NMOS FET and the PMOS FET (not explicitly shown) of the transmitter 302 or 322 to be turned on. As a result, the driver in the transmitter 302 or 322 drives a voltage onto the on-chip star network 320. The ATE tester 202 causes the pull-up resistor 356 to have a value based on the expected drive strength of the transmitter 302 or 322. The ATE tester 202 then sweeps the value of the pull-down resistor 358 to determine the voltage at which the transmitter 302 or 322 drives the voltage level of the on-chip star network 320. The voltage at which this transition occurs is then compared to a specific $V_{OH}$ parameter to determine whether the receiver 326 passed the output drive strength test.

During the $V_{OL}$ test, the ATE tester 202 causes the transmitter 302 or 322 to drive the on-chip star network 320 by enabling the NMOS FET and the PMOS FET (not explicitly shown) of the transmitter 302 or 322 to be turned on. As a result, the driver in the transmitter 302 or 322 drives a voltage onto the on-chip star network 320. The ATE tester 202 causes the pull-down resistor 358 to have a value based on the expected drive strength of the transmitter 302 or 322. The ATE tester 202 then sweeps the value of the pull-up resistor 356 to determine the voltage at which the transmitter 302 or 322 drives the voltage level of the on-chip star network 320. The voltage at which this transition occurs is then compared to a specific $V_{OL}$ parameter to determine whether the receiver 326 passed the output drive strength test.

FIGS. 7A-7E set forth a flow diagram of method steps for testing an integrated circuit, according to one embodiment of the present invention. Although the method steps are described in conjunction with the systems of FIGS. 1-6, persons skilled in the art will understand that any system configured to perform the method steps, in any order, is within the scope of the present disclosure.

As shown, a method 700 begins at step 702, where the ATE tester 202 determines that a test is to be performed using an on-chip star network 320 included in a device under test 206. At step 704, the ATE tester 202 determines whether the test is an input leakage test. If the test is an input leakage test, then the method 700 proceeds to step 706, where the ATE tester 202 causes the DAC 330 to be coupled to the on-chip star network 320. In some embodiments, the ATE tester 202 may cause multiplexer 332 to be enabled, thereby coupling the DAC 330 to the on-chip star network 320. At step 708, the ATE tester 202 causes the wide-range comparator 350 to be coupled to the on-chip star network 320. In some embodiments, the ATE tester 202 may cause test multiplexer 328 to be enabled, thereby coupling the wide-range comparator 350 to the on-chip star network 320. At step 710, the ATE tester 202 causes the transmitters 302 and 322 to enter a tristate mode, which prevents the transmitters 302 and 322 from driving I/O pads 304 and 324, respectively. At step 712, the ATE tester 202 causes the receiver under test, such as receiver 306, to be coupled to the on-chip star network 320. In some embodiments, the ATE tester 202 may cause a test multiplexer, such as test multiplexer 308, to be enabled, thereby coupling the receiver 306 to the on-chip star network 320.

At step 714, the ATE tester 202 causes PMOS FET 336 to enter an off-state, or be cut off, because PMOS FET 336 is not needed for performing a source current leakage test. At step 716, the ATE tester 202 causes NMOS FET 334 to supply a source current onto the on-chip star network 320. At step 718, the ATE tester 202 causes the VREF 354 voltage to gradually vary from a first value to a second value. In some embodiments, the ATE tester 202 causes the values of variable pull-up resistor 356 and variable pull-down resistor 358 to vary, thereby causing the VREF 354 voltage to vary. At step 720, as the VREF 354 voltage varies, the ATE tester 202 detects when the output of differential amplifier 352 changes from a first level to a second level. At step 722, the ATE tester 202 records the VREF 354 voltage at the point where the output of differential amplifier 352 changes from the first level to the second level. This recorded VREF 354 voltage represents the voltage present on the on-chip star network due to the input source leakage current of receiver 306.

At step 724, the ATE tester 202 causes NMOS FET 334 to enter an off-state, or be cut off, because NMOS FET 334 is not needed for performing a sink current leakage test. At step 726, the ATE tester 202 causes PMOS FET 336 to supply a sink current onto the on-chip star network 320. At step 728, the ATE tester 202 causes the VREF 354 voltage to gradually vary from a first value to a second value. In some embodiments, the ATE tester 202 causes the values of variable pull-up resistor 356 and variable pull-down resistor 358 to vary, thereby causing the VREF 354 voltage to vary. At step 730, as the VREF 354 voltage varies, the ATE tester 202 detects when the output of differential amplifier 352 changes from a first level to a second level. At step 732, the ATE tester 202 records the VREF 354 voltage at the point where the output of differential amplifier 352 changes from the first level to the second level. This recorded VREF 354 voltage represents the voltage present on the on-chip star network due to the input sink leakage current of receiver 306. The method 700 then terminates.

Returning to step 704, if the test is not an input leakage, then the method 700 proceeds to step 734, where the ATE tester 202 determines whether the test is an input voltage level threshold test. If the test is an input voltage level threshold test, then the method 700 proceeds to step 736, where the ATE tester 202 causes the DAC 330 to be coupled to the on-chip star network 320. In some embodiments, the ATE tester 202 may cause multiplexer 332 to be enabled, thereby coupling the DAC 330 to the on-chip star network 320. At step 738, the ATE tester 202 causes the transmitters 302 and 322 to enter a tristate mode, which prevents the transmitters 302 and 322 from driving I/O pads 304 and 324, respectively. At step 740, the ATE tester 202 causes the receiver under test, such as receiver 326, to be coupled to the on-chip star network 320. In some embodiments, the ATE tester 202 may cause a test multiplexer, such as test multiplexer 328, to be enabled, thereby coupling a first input of the receiver 326 to the on-chip star network 320.

At step 742, the ATE tester 202 causes NMOS FET 334 and PMOS FET 336 to supply a reference voltage onto the on-chip star network 320 and, in turn, to the first input of receiver 326. At step 744, the ATE tester 202 causes VREF 360 to supply a reference voltage to a second input of receiver 326.

At step 746, the ATE tester 202 causes the VREF 360 voltage to gradually increase from a first value to a second value. In some embodiments, the ATE tester 202 causes the values of variable pull-up resistor 362 and variable pull-down resistor 364 to vary, thereby causing the VREF 360 voltage to vary. At step 748, as the VREF 354 voltage increases, the ATE tester 202 detects when the output of receiver 326 changes from a first level to a second level. At step 750, the ATE tester 202 records the VREF 360 voltage at the point where the output of receiver 326 changes from the first level to the second level. This recorded VREF 360 voltage represents a first $V_{IH}$ value of receiver 326.

At step 752, the ATE tester 202 causes the DAC 330 voltage to gradually increase from a first value to a second value. In some embodiments, the ATE tester 202 causes the values of gain of NMOS FET 334 and the gain of PMOS FET 336 to vary, thereby causing the DAC 330 voltage to vary. At step 754, as the DAC 330 voltage increases, the ATE tester 202 detects when the output of receiver 326 changes from a first level to a second level. At step 756, the ATE tester 202 records the DAC 330 voltage at the point where the output of receiver 326 changes from the first level to the second level. This recorded DAC 330 voltage represents a second $V_{IH}$ value of receiver 326.

At step 758, the ATE tester 202 causes the VREF 360 voltage to gradually decrease from a first value to a second value. In some embodiments, the ATE tester 202 causes the values of variable pull-up resistor 362 and variable pull-down resistor 364 to vary, thereby causing the VREF 360 voltage to vary. At step 760, as the VREF 354 voltage decreases, the ATE tester 202 detects when the output of receiver 326 changes from a first level to a second level. At step 762, the ATE tester 202 records the VREF 360 voltage at the point where the output of receiver 326 changes from the first level to the second level. This recorded VREF 360 voltage represents a first $V_{IL}$ value of receiver 326.

At step 764, the ATE tester 202 causes the DAC 330 voltage to gradually decrease from a first value to a second value. In some embodiments, the ATE tester 202 causes the values of gain of NMOS FET 334 and the gain of PMOS FET 336 to vary, thereby causing the DAC 330 voltage to vary. At step 766, as the DAC 330 voltage decreases, the ATE tester 202 detects when the output of receiver 326 changes from a first level to a second level. At step 768, the ATE tester 202 records the DAC 330 voltage at the point where the output of receiver 326 changes from the first level to the second level. This recorded DAC 330 voltage represents a second $V_{IL}$ value of receiver 326. The method 700 then terminates.

Returning to step 734, if the test is not an input voltage level threshold test, then the test is an output drive strength test. The method 700 proceeds to step 770, where the ATE tester 202, where the ATE tester 202 causes the DAC 330 to be isolated from the on-chip star network 320. In some embodiments, the ATE tester 202 may cause multiplexer 332 to be disabled, thereby isolating the DAC 330 from the on-chip star network 320. At step 772, the ATE tester 202 causes the wide-range comparator 350 to be coupled to the on-chip star network 320. In some embodiments, the ATE tester 202 may cause test multiplexer 328 to be enabled, thereby coupling the wide-range comparator 350 to the on-chip star network 320. At step 774, the ATE tester 202 causes the transmitters 302 and 322 to enter an active mode, thereby causing the transmitters 302 and 322 to drive I/O pads 304 and 324, respectively. At step 776, the ATE tester 202 causes the transmitter under test, such as transmitter 302, to be coupled to the on-chip star network 320. In some embodiments, the ATE tester 202 may cause a test multiplexer, such as test multiplexer 374, to be enabled, thereby coupling the transmitter 302 to the on-chip star network 320.

At step 778, the ATE tester 202 causes the value of variable pull-up resistor 356 to be set based on the expected $V_{OH}$ drive strength of transmitter 302. At step 780, the ATE tester 202 causes the value of variable pull-down resistor 358 to gradually vary from a first value to a second value. At step 782, as the value of variable pull-down resistor 358 varies, the ATE tester 202 detects when the output of differential amplifier 352 changes from a first level to a second level. At step 784, the ATE tester 202 records the VREF 360 voltage at the point where the output of differential amplifier 352 changes from the first level to the second level. This recorded VREF 360 voltage represents the $V_{OH}$ value of transmitter 302.

At step 786, the ATE tester 202 causes the value of variable pull-down resistor 358 to be set based on the expected $V_{OL}$ drive strength of transmitter 302. At step 788, the ATE tester 202 causes the value of variable pull-up resistor 356 to gradually vary from a first value to a second value. At step 790, as the value of variable pull-up resistor 356 varies, the ATE tester 202 detects when the output of differential amplifier 352 changes from a first level to a second level. At step 792, the ATE tester 202 records the VREF 360 voltage at the point where the output of differential amplifier 352 changes from the first level to the second level. This recorded VREF 360 voltage represents the $V_{OL}$ value of transmitter 302. The method 700 then terminates.

In sum, an integrated circuit includes an on-chip star network for each group of I/O pads. Each group of I/O pads also includes wide-range comparator and a digital-to-analog converter. Multiplexers associated with the on-chip star network may be configured to perform input leakage testing, input voltage level threshold testing, and output drive strength testing with minimal contact to the ATE test channels of the ATE system. In a first test pass, integrated circuits are tested via the on-chip star network to detect integrated circuits that do not meet specifications. The ATE can also perform tests on each I/O pad in the group by connecting to the I/O pad groups via a single ATE test channel. The ATE system can perform further, more precise testing during additional test passes via such a connection.

At least one advantage of the disclosed technique is that IO leakage and DC parametric testing may be performed on integrated circuits with high I/O pad counts using an ATE system with a significantly lower quantity of ATE test channels relative to prior approaches. As a result, lower cost, more readily available ATE systems can be used for such integrated circuit testing. Another advantage of the disclosed technique is that ATE systems with a high quantity of ATE test channels may perform testing on multiple integrated circuits simultaneously, even without using a custom load board fitted with mechanical relays. As a result, test times are improved and the load board does not need to be replaced due to relays that have reached the usage limit.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. An integrated circuit, comprising:
   a plurality of input/output (I/O) pad groups, wherein each I/O pad group comprises:
      an on-chip star network;
      a plurality of I/O pads;
      a plurality of test multiplexers, wherein each test multiplexer included in the plurality of test multiplexers couples a different I/O pad to the on-chip star network;
      a digital-to-analog converter (DAC) configured to supply at least one of a source current, a sink current, and a first reference voltage to the on-chip star network; and
      a wide-range comparator configured to compare a voltage present on a selected I/O pad included in the plurality of I/O pads with a second reference voltage, wherein a first test multiplexer included in the plurality of test multiplexers couples to a first I/O pad included in the plurality of I/O pads and further couples the wide-range comparator to the on-chip star network.

2. The integrated circuit of claim 1, wherein each I/O pad included in the plurality of I/O pads is associated with a different receiver included in a plurality of receivers and a different transmitter included in a plurality of transmitters.

3. The integrated circuit of claim 1, wherein the digital-to-analog converter (DAC) comprises:
   a first field-effect transistor (FET) disposed between a voltage source and a first junction; and
   a second FET disposed between the first junction and ground,
   wherein the first FET and the second FET are operable to supply the at least one of a source current, a sink current, and a first reference voltage to the on-chip star network.

4. The integrated circuit of claim 3, wherein the DAC further comprises a multiplexer configured to couple the first junction to the on-chip star network.

5. The integrated circuit of claim 3, wherein, when the DAC is configured to supply the source current, the second FET is configured to be in an off-state, and the first FET is configured to supply the source current to the on-chip star network.

6. The integrated circuit of claim 3, wherein, when the DAC is configured to supply the sink current, the first FET is configured to be in an off-state, and the second FET is configured to supply the sink current to the on-chip star network.

7. The integrated circuit of claim 3, wherein, when the DAC is configured to supply the first reference voltage, the first FET and the second FET form a voltage divider that supplies the source current to the on-chip star network.

8. The integrated circuit of claim 1, wherein the wide-range comparator comprises a differential amplifier with a first input coupled to the selected I/O pad and a second input coupled to the second reference voltage.

9. The integrated circuit of claim 8, wherein the wide-range comparator further comprises a voltage divider configured to supply the reference voltage to the second input.

10. The integrated circuit of claim 8, wherein the wide-range comparator further comprises a multiplexer that is configured to couple the first input to the selected I/O pad.

11. A method for testing an integrated circuit that includes an on-chip star network, the method comprising:
   causing each test multiplexer included in a plurality of test multiplexers located on the integrated circuit to couple a different input/output (I/O) pad of the integrated circuit to the on-chip star network;
   causing a digital-to-analog converter (DAC) located on the integrated circuit to supply at least one of a source current, a sink current, and a first reference voltage to the on-chip star network; and
   causing a wide-range comparator located on the integrated circuit to compare a voltage present on a selected I/O pad with a second reference voltage, wherein a first test multiplexer included in the plurality of test multiplexers couples to a first I/O pad included in the plurality of I/O pads and further couples the wide-range comparator to the on-chip star network.

12. The method of claim 11, wherein the first I/O pad is included in a plurality of I/O pads, and each test multiplexer is configured to couple a different I/O pad included in a plurality of I/O pads to the on-chip star network.

13. The method of claim 12, wherein each I/O pad included in the plurality of I/O pads is associated with a different receiver included in a plurality of receivers and a different transmitter included in a plurality of transmitters.

14. The method of claim 12, further comprising:
   causing the first test multiplexer to isolate the first I/O pad from the on-chip star network; and
   causing a second test multiplexer included in the plurality of test multiplexers to couple a second input/output (I/O) pad included in the plurality of I/O pads to the on-chip star network.

15. The method of claim 11, wherein causing the DAC located on the integrated circuit to supply at least one of a source current, a sink current, and a first reference voltage to the on-chip star network comprises causing a multiplexer associated with the DAC to couple the DAC to the on-chip star network.

16. A non-transitory computer-readable storage medium including instructions that, when executed by a processor, cause the processor to test an integrated circuit that includes an on-chip star network, by performing the steps of:
   causing each test multiplexer included in a plurality of test multiplexers located on the integrated circuit to couple a different input/output (I/O) pad of the integrated circuit to the on-chip star network;
   causing a digital-to-analog converter (DAC) located on the integrated circuit to supply at least one of a source current, a sink current, and a first reference voltage to the on-chip star network; and
   causing a wide-range comparator located on the integrated circuit to compare a voltage present on a selected I/O pad with a second reference voltage, wherein a first test multiplexer included in the plurality of test multiplexers couples to a first I/O pad included in the plurality of I/O pads and further couples the wide-range comparator to the on-chip star network.

17. The non-transitory computer-readable storage medium of claim 16, wherein the first I/O pad is included in a plurality of I/O pads, and each test multiplexer is configured to couple a different I/O pad included in a plurality of I/O pads to the on-chip star network.

18. The non-transitory computer-readable storage medium of claim 17, wherein each I/O pad included in the plurality of I/O pads is associated with a different receiver included in a plurality of receivers and a different transmitter included in a plurality of transmitters.

19. The non-transitory computer-readable storage medium of claim 17, further including instructions that, when executed by a processor, cause the processor to perform the steps of:
   causing the first test multiplexer to isolate the first I/O pad from the on-chip star network; and
   causing a second test multiplexer included in the plurality of test multiplexers to couple a second input/output (I/O) pad included in the plurality of I/O pads to the on-chip star network.

20. The non-transitory computer-readable storage medium of claim 16, wherein causing the DAC located on the integrated circuit to supply at least one of a source current, a sink current, and a first reference voltage to the on-chip star network comprises causing a multiplexer associated with the DAC to couple the DAC to the on-chip star network.

* * * * *